United States Patent [19]

Lewis

[11] 3,921,093

[45] Nov. 18, 1975

[54] ACOUSTIC WAVE OSCILLATOR

[75] Inventor: Meirion Francis Lewis, Malvern, England

[73] Assignee: The Secretary of State for Defence in Her Britannic Majesty's Government of the United Kingdom of Great Britain and Northern Ireland, London, England

[22] Filed: Nov. 6, 1974

[21] Appl. No.: 521,400

[30] Foreign Application Priority Data

Nov. 9, 1973 United Kingdom.............. 52237/73

[52] U.S. Cl................ 331/1 A; 331/32; 331/107 A; 332/26

[51] Int. Cl.[2]........................................... H03B 3/04

[58] Field of Search................. 331/107 A, 1 R, 32; 330/5.5; 332/26

[56] References Cited

UNITED STATES PATENTS 3,582,540 6/1971 Adler............................ 331/107 A

*Primary Examiner*—John Kominski

*Attorney, Agent, or Firm*—Cushman, Darby & Cushman

[57] ABSTRACT

A SAW oscillator comprises a SAW delay line forming a feedback loop to an amplifier and a discriminator formed with the SAW delay line to provide a control signal for controlling the oscillator frequency. The discriminator may be used to shorten the period required by the oscillator to stabilise its frequency, or may be used in conjunction with a differential amplifier to obtain frequency modulation of the oscillator frequency.

8 Claims, 8 Drawing Figures

ACOUSTIC WAVE OSCILLATOR

This invention relates to acoustic wave oscillators and provides a frequency controlled acoustic wave oscillator. These oscillators may use surface acoustic waves (SAW) propagated on the surface of a device or bulk acoustic waves (BAW) propagated within the device.

Oscillators using SAW are described in UK Pat. Application Nos. 7780/73, 20418/73 and 27095/73. In general a SAW oscillator comprises a SAW delay line forming a feedback loop to an amplifier. The SAW delay line comprises a piezoelectric substrate material having a flat surface on which are mounted input and output interdigital comb transducers. When these transducers are connected to the input and output of the amplifier the device will oscillate at a frequency primarily determined by the dimensions of the transducer finger spacing and transducer separation.

In the specification 7780/73 there is described an oscillator having strong mode selection; this is achieved by making the effective length of one transducer equal to the distance apart from the centres of both transducers. Frequency modulation may be achieved by use of a phase shift network in the amplifier circuit.

In the specification 20418/73 there is described an arrangement for compensating for temperature dependent phase shift in the amplifying circuit. This is achieved by using a phase sensitive detector to measure the phase difference between the two transducers for applying correcting signals to the amplifying circuit. The phase sensitive detector is arranged to have a long time constant so that the oscillator frequency may be modulated at high frequencies.

One problem with known oscillators is the time after initial switch on until their frequency becomes stabilised.

Another problem with SAW oscillators is that their output voltage does not vary linearly with frequency, or varies linearly over only a small frequency range.

According to this invention an acoustic wave device includes an acoustic wave delay line for providing a feedback loop to an amplifier to form an oscillator, and a discriminator for providing a control signal to apply to phase shift circuitry in the feedback loop for varying the frequency of the oscillator, the delay line comprising a substrate able to support acoustic waves along a flat surface thereof, input and output transducers for launching and receiving acoustic waves in the substrate, the discriminator comprising at least one transducer arranged on the substrate to receive acoustic waves from the input transducer and provide a control signal.

Preferably the control signal is linear with frequency near the oscillator centre frequency.

When used with the amplifier and phase shift circuitry the device of this invention may include a differential amplifier arranged between the discriminator amplifier and the phase shift circuitry with one input to the differential amplifier connected to the output of the discriminator with its other input arranged to receive modulated voltage signals and with its output connected to the phase shift circuitry.

The SAW delay line is arranged to have strong mode selection; this may be achieved by designing the frequency response of input and output transducers so that all frequencies except the centre frequency are suppressed.

The substrate may be piezoelectric, e.g. quartz or lithium niobate, or non-piezoelectric with piezoelectric regions deposited on the substrate above or under the transducers.

The invention will now be described by way of example with reference to the accompanying drawings in which.

Figure 1:
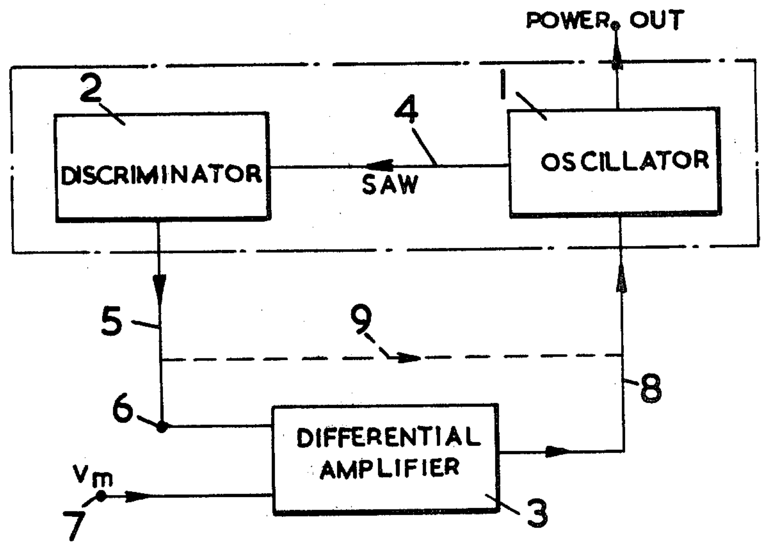
FIG. 1 is a block diagram explaining operation of the invention.

It should be noted that the drawings are diagrammatic and not to scale; for example an interdigital comb transducer may have up to 100 and more finger pairs of electrodes, in the drawings only a few finger pairs are shown or the transducer illustrated by a block.

As shown in FIG. 1 a frequency modulated SAW oscillator includes a voltage controlable oscillator 1, a SAW frequency discriminator 2 and a differential amplifier 3. An output 4 from the oscillator 1 is fed in the form of surface acoustic waves into the frequency discriminator 2 whose internally amplified output 5 is fed into one input 6 of the differential amplifier. A modulating voltage Vm may be fed into a second input 7 of the differential amplifier 3. The output 8 of the differential amplifier 3 is fed into the oscillator 1. Alternatively as shown by the dotted line 9 the discriminator output 5 may be fed direct into the oscillator 1 to assist frequency locking of the oscillator 1.

Figure 2:
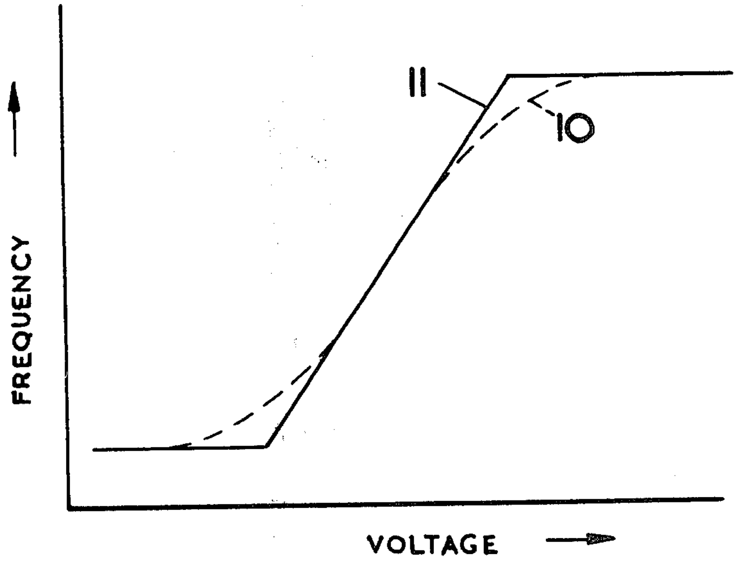
FIG. 2 is a graph of voltage against oscillator frequency of operation.

FIG. 2 is a graph of voltage against frequency. The broken line 10 indicates how the voltage from the oscillator varies with frequency and shows a linear slope for a very limited range. Thus if an oscillator 1 is to be used in circuitry requiring a linear relation between output voltage and frequency of operation the operating frequency range is limited. The solid line 11 in FIG. 2 represents the desired frequency response and shows a linear slope over a comparatively large frequency range. As will be described below the discriminator output varies linearly with frequency and this characteristic is used to modify the output of the oscillator 1 and increase the frequency range over which its output is linear.

In operation the frequency discriminator 2 samples surface acoustic waves from the oscillator 1 and produces a dc correcting signal proportional to a frequency deviation from a designated value. If the designated frequency is $w_o$ then increasing frequency above $w_o$ will result in an increasing positive dc correcting signal and similarly a decreasing frequency $w_o$ will result in an increasing negative dc control signal.

If the discriminator is to be used to lock the frequency of an oscillator then its output may be fed direct into the oscillator as indicated by the broken line 9 in FIG. 1. Alternatively a zero Vm may be applied to the differential amplifier 3. Thus if the oscillator frequency drifts away from $w_o$ then a correcting signal is applied to the oscillator. By this means the time required for an oscillator frequency to become stabilised after the initial switching may be reduced by at least an order of magnitude. Also the oscillator 1 may be corrected for slow frequency changes such as temperature or supply voltage variable phase changes in an oscillator amplifier.

If the device is to be used as a frequency modulated (FM) oscillator then as the value of $V_m$ changes the output of the discriminator will follow so that both inputs to the differential amplifier are equal and its output nearly zero. Since the voltage output of the discriminator varies linearly with frequency the frequency of the oscillator will also vary linearly with voltage $V_m$. This requires the response of both differential amplifier and discriminator to be much faster than the frequency of modulation and also the response of the discriminator to be faster than that of the differential amplifier.

Figure 4:
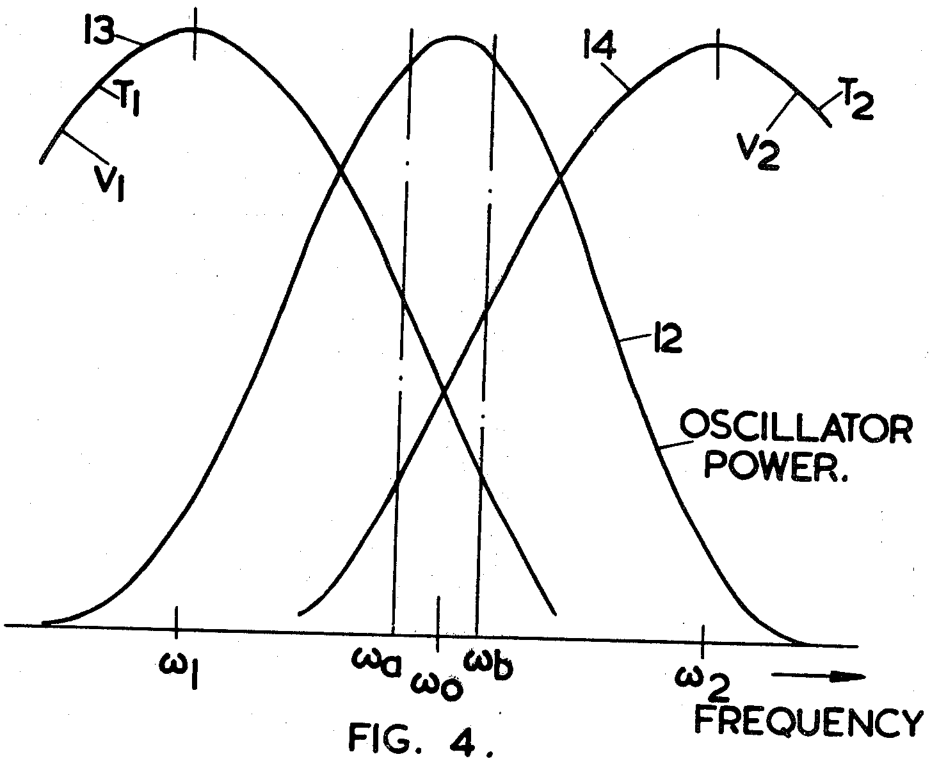
FIG. 4 is a graph of transducer and oscillator output against frequency.
Figure 5:
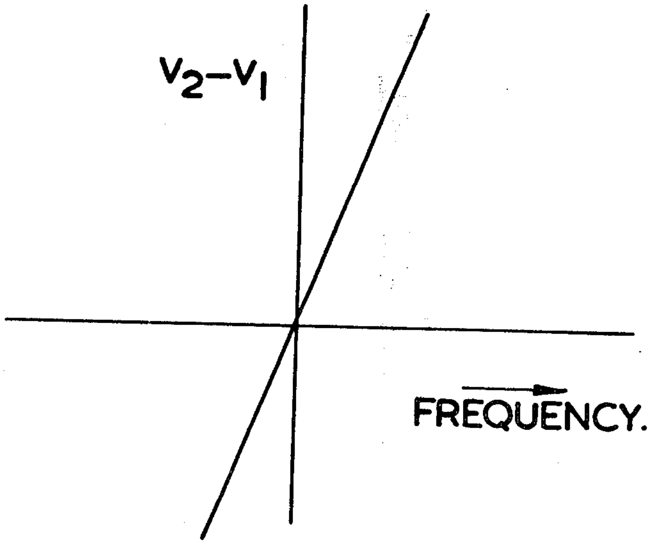
FIG. 5 is a graph showing output voltage against frequency for the discriminator unit.

FIG. 4 shows the frequency response, power output 12, of the oscillator 1 FIG. 1, and the response 13, 14 in volts of two transducers T1, T2 which may form part of a discriminator 2. As shown the oscillator centre frequency is $w_o$ and the centre frequency of $T_1$, $T_2$ are $w_1$ and $w_2$ respectively with $w_2 > w_o > w_1$. At frequency $w_o$ the output $V_1$ of $T_1$ equals the output $V_2$ of $T_2$ and at either side of $w_o$ there is a region where $V_2$–$V_1$ varies linearly with frequency as shown in FIG. 5. As an example a device has been made in which $w_o$ = 20MHz, $w_1$ = 19.5MHz, $w_2$ = 20.5MHz and $V_2$–$V_1$ was linear over a range of 150kHz. This linear variation may be used in conjunction with a differential amplifier to stabilise the frequency of the oscillator 1.

Figure 3:
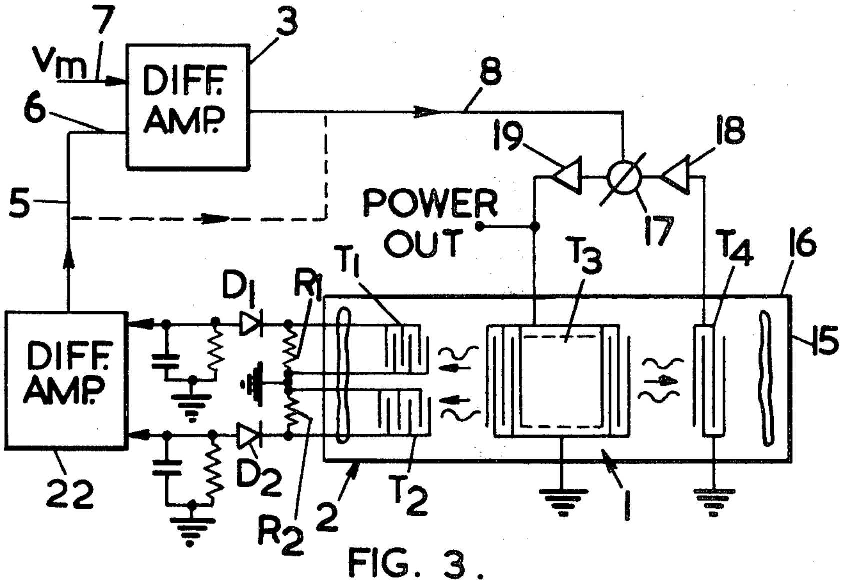
FIG. 3 is a partly diagrammatic view of one form of the invention.

Such an arrangement is shown in Fig. 3 and comprises a piezoelectric substrate 15 such as single crystal ST cut quartz, having a flat upper surface 16. Formed on this surface 16 by conventional photolithographic techniques are four interdigital comb shaped transducers, $T_1$, $T_2$, $T_3$, $T_4$. The oscillator 1 comprises transducers $T_3$ and $T_4$ together with a phase shift circuit 17 and two amplifiers 18, 19 in series. As described in U.K. Pat. Application No. 7880/73 the length of $T_3$ is made equal to the distance between centres of $T_3$ and $T_4$ to provide strong mode selection.

When electrical power is applied to the amplifier 1 the surface acoustic waves radiating from the input transducer $T_3$ gradually adjust in frequency until only waves at frequency $w_o$ are propagating from $T_3$ to $T_4$.

The discriminator comprises the two interdigital comb transducers $T_1$, $T_2$, which are spaced with their centres equal distance from $T_3$, and a differential amplifier 22. As shown in the two tranducers $T_1$, $T_2$ are connected together through resistances $R_1$ and $R_2$ to allow dc current rectified by diodes $D_1$ and $D_2$ to return. Outputs $V_1$, $V_2$from $T_1$, $T_2$ are fed into the two inputs 20, 21 of the differential amplifier 22 whose output 5 is proportional to $V_2$–$V_1$. The output 5 from the discriminator differential amplifier 22 is fed into one input 6 of a second differential amplifier 3; a modulating voltage Vm may be applied to the second input 7 of this differential amplifier 3. The output 8 from differential amplifier 3 is applied to the phase shifting circuitry 17 of the oscillator 1. Strips of damping material are arranged near the ends of the surface 16 to prevent SAW reflections from the ends of the substrate.

Operation of the device is as follows: assume zero modulating voltage is applied to the differential amplifier 3 and the oscillator 1 is operating at a frequency of $w_o$. The outputs $V_1$, $V_2$ from $T_1$, $T_2$ are essentially equal and so the output of the differential amplifier 22 is zero. If the oscillator frequency changes to a value greater than $w_o$ then $V_2$ is greater than $V_1$ and a positive correcting signal is applied from differential amplifier 22 into differential amplifier 3 resulting in a positive signal being applied to the phase shift circuitry 17. This signal, which is proportional to the deviation from $w_o$, is used by the phase shift circuit 17 to change the oscillator frequency back to $w_o$, since the modulating voltage is zero representing a frequency of $w_o$.

Similarly if the oscillator frequency falls below $w_o$ the differential amplifier 22 provides a negative correcting signal into differential amplifier 3 and hence the phase shift circuitry 17 to raise the oscillator frequency back to $w_o$. If now a voltage Vm of say + 1 volt dc is applied to differential amplifier 3 then a positive signal is applied to the phase shift circuitry 17 and results in an increase in oscillator frequency. The oscillator frequency will change until the signal $V_2$–$V_1$, after amplifying the differential amplifier 22, equals + 1 volt; the output of differential amplifier 3 is then amplifier 22, equals + 1 volt; the output of differential amplifier 3 is then zero and the oscillator is operating at a new frequency corresponding to a voltage Vm of +1v as determined by the shape of $V_2$–$V_1$/frequency FIG. 5. Thus the frequency of oscillator varies linearly with Vm. In practice the voltage Vm is modulated voltage but providing the response rates of both differential amplifiers are fast enough the oscillator frequency will vary linearly with a modulated voltage Vm.

Figure 6:
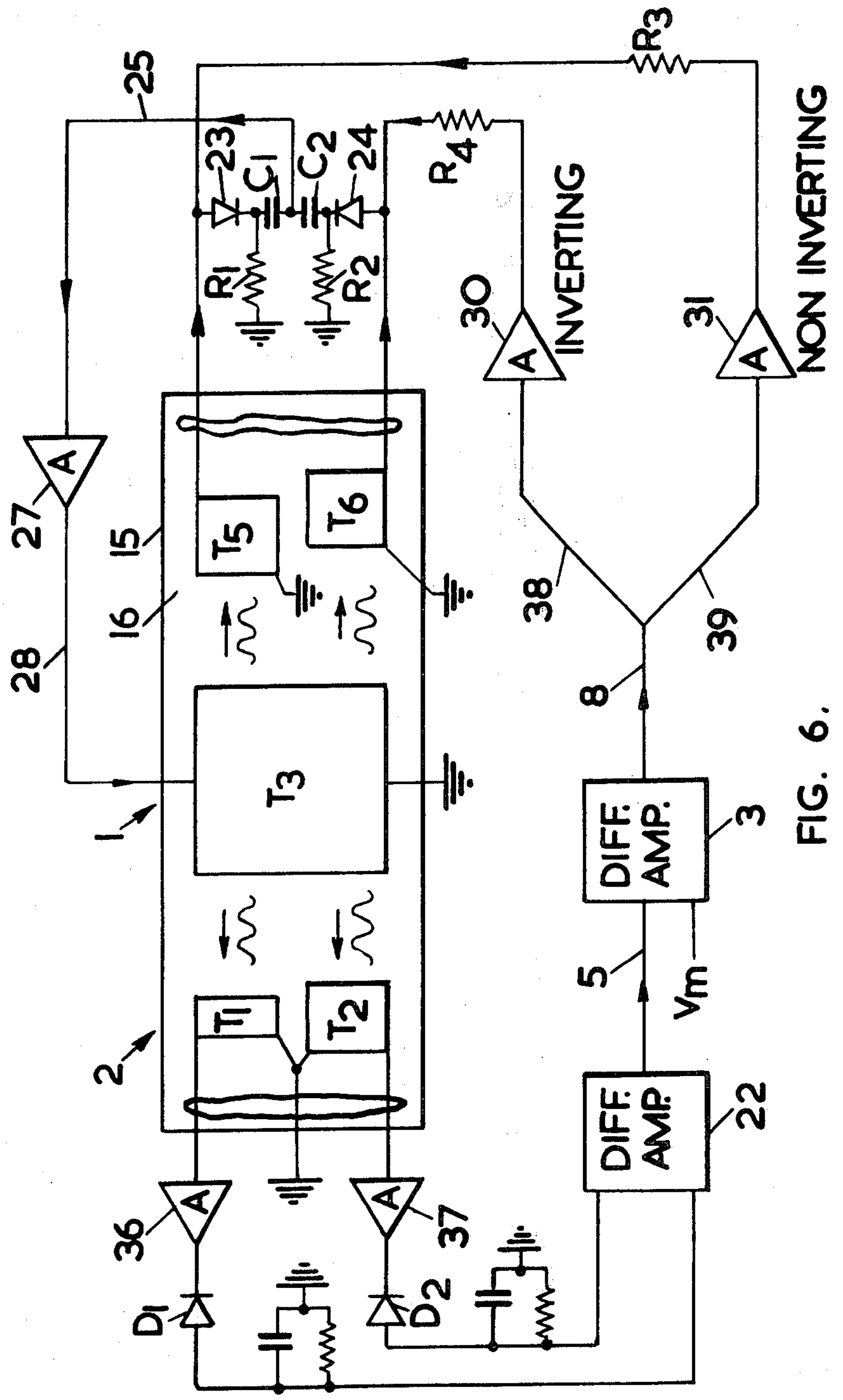
FIG. 6 shows an alternative form of the invention.

FIG. 6 shows an alternative arrangement both of the oscillator 1 and discriminator 2. The oscillator 1 comprises a piezo-electric substrate 15 with a flat upper surface 16 supporting an input transducer $T_3$, as before, and two identical output transducers $T_5$, $T_6$ arranged with $T_6$ spaced one quarter wavelength (at a frequency of $w_o$) further from $T_3$ than $T_5$. Outputs from $T_5$ $T_6$ are connected together through two PIN diodes 23, 24 and two capacitors $C_1$, $C_2$ arranged back to back. The diodes are connected to earth through resistance R, R. An output 25 is taken from between the capacitor $C_1$, $C_2$ to the input of amplifier 27 whose output 28 connects with input transducer $T_3$.

The discriminator section 2 comprises, as in FIG. 3, interdigital comb transducers $T_1$, $T_2$ having centre frequencies of $w_1$, $w_2$ respectively where $w_1 > w_o > w_2$, $w_o$ being the centre frequency of the oscillator 1. The transducers $T_1$, $T_2$ are mounted on the substrate 15 with their centres equal distance from the oscillator input transducer $T_3$. One half of each transducer $T_1$, $T_2$ is connected to earth, whilst the other half is separately connected through an amplifier 36, 37 and diode $D_1$, $D_2$ to the two inputs of a differential amplifier 22. A second differential amplifier 3 has one input connected to the output 5 of the first differential amplifier 22 and another input to which a modulated voltage Vm may be applied. The output of the differential amplifier 3 is split into two branches 38, 39; one branch 38 is connected through a resistor $R_4$ and an inverting amplifier 30 to the transducer $T_6$ whilst the other branch 39 is connected through a resistor $R_3$ and a non-inverting amplifier 31 to transducer $T_5$.

In operation when power is supplied to the oscillator amplifier 27 the oscillator 1 will gradually settle down to oscillate at frequency $w_o$. Output from the transducer $T_5$, $T_6$ to the amplifier 27 is through the two PIN diodes 23, 24, which act as a variable resistor proportioning the outputs from $T_5$, $T_6$ in accordance with the signal strength and polarity from the differential amplifier 3. Since $T_6$ is lagging in phase by 90° this proportioning is used to adjust the oscillator frequency as required. Thus the oscillator frequency is controlled by a voltage applied by the differential amplifier 3.

The discriminator transducer $T_1$, $T_2$ receive surface acoustic waves from the oscillator transducer $T_3$ and feed their outputs into the differential amplifier 22. If the received frequency is at $w_o$ the outputs of $T_1$, $T_2$ are equal and therefore the output of the differential amplifier 22 is zero. However if the oscillator frequency changes from $w_o$ then a correcting signal will be applied by the differential amplifier 22 as previously described with reference to FIG. 3. Similarly when a modulating voltage $V_m$ is applied to the differential amplifier 3 the oscillator frequency will vary linearly with modulating voltage as previously described with reference to FIG. 3.

Figure 7:
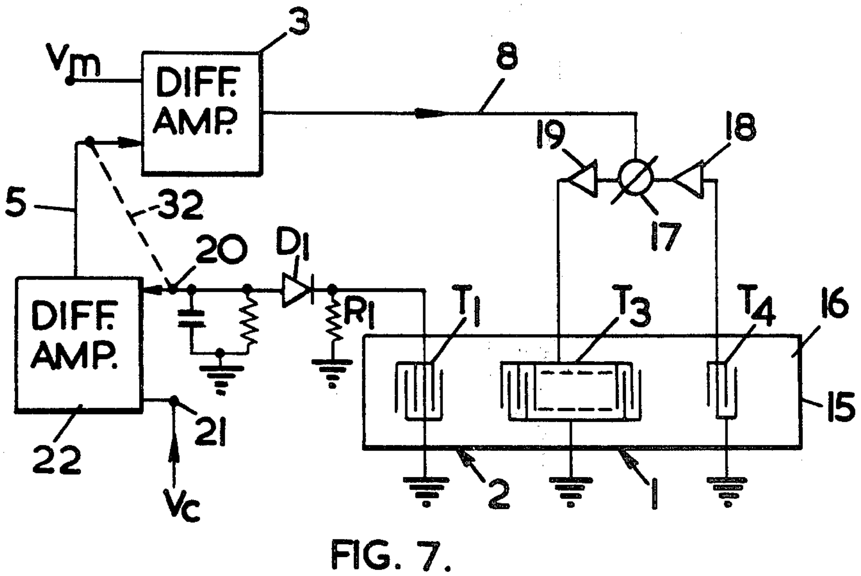
FIG. 7 shows a simple form of frequency modulated oscillator.

FIG. 7 shows a simple form of frequency modulated oscillator in which the oscillator section 1 is as shown in FIG. 3 with identical reference numerals. The discriminator section 2 however uses only one transducer $T_1$ whose output is fed through a diode $D_1$ to one input 20 of a differential amplifier 22. The output of $T_1$ is also connected through a resistance R to earth. A voltage of $V_c$ is applicable to another input 21 of the differential amplifier 22. An output 5 from the differential amplifier 22 is fed into a differential amplifier 3 to which a modulating voltage $V_m$ is applicable. As in FIG. 3 the output 8 from differential amplifier 3 is fed into the oscillator 1 phase shift circuitry 17.

Figure 8:
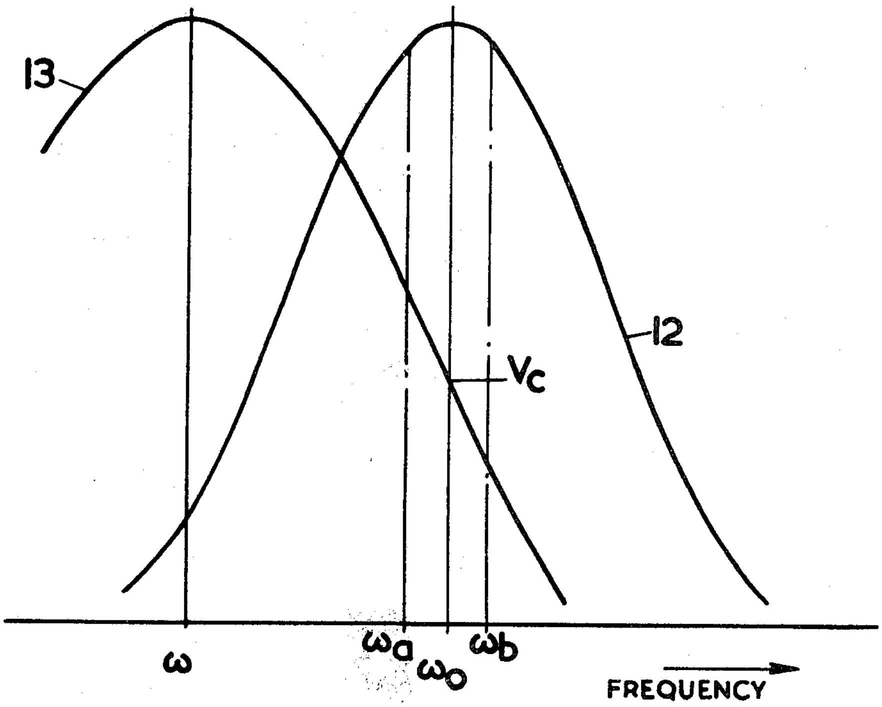
FIG. 8 shows the output of the oscillator and discriminator against frequency for the arrangement of FIG. 7.

FIG. 8 shows the responses 12, 13 of the oscillator 1 and the transducer $T_1$. It is desired to vary the oscillator frequency over the range $w_a$ to $w_b$ and over this range it is seen that the response of $T_1$ is linear.

At the frequency $w_o$ the voltage output of $T_1$ is indicated at $V_c$. Thus if a dc voltage of $V_c$ is applied to the input 21 of the differential amplifier 22 its output 5 will be a positive or negative correcting signal which varies in magnitude with variation of oscillator frequency about $w_o$ to ensure the oscillator frequency varies linearly with a modulated voltage $V_m$ applied to the differential amplifier 3. Alternatively the output of $T_1$ may be connected through diode $D_1$ to the differential amplifier 3 as indicated by the broken line 32. In this case the voltage $V_m$ will be modulated about a voltage level of $V_c$.

If the devices shown in FIGS. 3, 6, 7 are to operate using bulk acoustic waves (BAW) then damping material is applied to the surface 16 of the substrate 15 between the transducers and the electrical circuitry tuned as necessary.

I claim:

1. An acoustic wave device including an acoustic wave delay line providing a feedback loop to an amplifier to form an oscillator, and a discriminator for providing a control signal to apply to phase shift circuitry in the feedback loop for varying the frequency of the oscillator, the delay line comprising a substrate able to support acoustic waves along a flat surface thereof, input and output transducers for launching and receiving acoustic waves in the substrate, the discriminator comprising at least one transducer arranged on the substrate to receive acoustic waves from the input transducer and provide a control signal which is substantially linear with frequency near the oscillator centre frequency.

2. An acoustic wave device according to claim 1 and further comprising a differential amplifier having one input connected to the discriminator and a second input to which modulated signals may be supplied, and having an output connected to the phase shift circuitry.

3. An acoustic wave device according to claim 1 wherein the discriminator comprises two transducers one having a centre frequency above the centre frequency of the oscillator and the other having a centre frequency below the centre frequency of the oscillator.

4. An acoustic wave device according to claim 1 wherein the discriminator comprises a single transducer whose centre frequency is different from that of the oscillator centre frequency and whose response is linear around the oscillator centre frequency.

5. An acoustic wave device according to claim 1 wherein the delay line has two output transducers spaced apart along a path of acoustic waves from the input transducer and wherein the two output transducers are connected to variable resistors whereby the phase of feedback to the amplifier may be varied to vary the oscillator frequency.

6. An acoustic wave device according to claim 3 and further comprising a discriminator differential amplifier having two inputs and an output, and wherein the inputs are connected one to each of the discriminator transducers and the output forms the control signal.

7. An acoustic wave device according to claim 6 and further comprising a differential amplifier having two inputs and an output, wherein one input is connected to the output of the discriminator differential amplifier and one input may have applied thereto a modulated signal, and wherein the output is connected to the phase shift circuitry.

8. A surface acoustic wave oscillator comprising:

a piezoelectric substrate having a flat surface on which input and output interdigital comblike transducers are arranged to provide a feedback loop to an amplifier for causing oscillations thereof;

phase shift circuitry in the feedback loop for varying the frequency of oscillation in response to a control signal;

two interdigital comblike discriminator transducers arranged on the substrate for receiving surface acoustic waves from the input transducer, one of the discriminator transducers having a centre frequency below the oscillator centre frequency and the other of the discriminator transducers having centre frequency above the oscillator centre frequency;

a discriminator differential amplifier having two inputs and output, the inputs being connected on to each of the discriminator transducers and the output providing a control signal;

a further differential amplifier having two inputs and an output, one of the inputs being connected to the output of the discriminator amplifier output, and the other input arranged for supply with a modulated signal, and the output connected to the phase shift circuitry in the oscillator feedback loop.

* * * * *